United States Patent [19]

Leipert

[11] Patent Number: 4,823,099
[45] Date of Patent: Apr. 18, 1989

[54] TELEVISION TUNER FOR THREE DIFFERENT FREQUENCY RANGES

[75] Inventor: Emil Leipert, Neustadt, Fed. Rep. of Germany

[73] Assignee: Telefunken Electronic GmbH, Heilbronn, Fed. Rep. of Germany

[21] Appl. No.: 103,140

[22] Filed: Oct. 1, 1987

[30] Foreign Application Priority Data

Oct. 1, 1986 [DE] Fed. Rep. of Germany ....... 3633384

[51] Int. Cl.⁴ ............................................... H03J 5/24
[52] U.S. Cl. ........................................ 334/15; 334/47; 455/191
[58] Field of Search .................... 334/15, 47; 455/188, 455/191, 339

[56] References Cited

U.S. PATENT DOCUMENTS 3,980,957 9/1976 Pützer ............................... 334/15 X
4,577,171 3/1986 Heigl et al. ....................... 334/47 X
4,710,973 12/1987 Suzuki ............................. 334/15 X

FOREIGN PATENT DOCUMENTS 145076 6/1965 European Pat. Off. .
3538921 5/1987 Fed. Rep. of Germany .

Primary Examiner—Paul Gensler
Attorney, Agent, or Firm—Spencer & Frank

[57] ABSTRACT

A television tuner for three different frequency ranges comprises a common antenna connection for three input filter circuits (1, 2, 3). In order to obtain a simple circuit design which involves negligible mutual capacitive loads from the input filter circuits (1, 2, 3), the antenna connection (4) is spatially associated with the input filter circuit (3) for the highest frequency range and is directly connected to one end of a coupling conductor (5). The coupling conductor (5) is series-connected directly with the connection for input filter circuit (1) of the lowest frequency range I and, via a switching diode (11), with the input filter circuit (2) for the medium frequency range II. A further switch (12) detunes the input filter circuit (3) for the highest frequency range III if one of the other input filter circuits (1, 2) is activated.

5 Claims, 1 Drawing Sheet

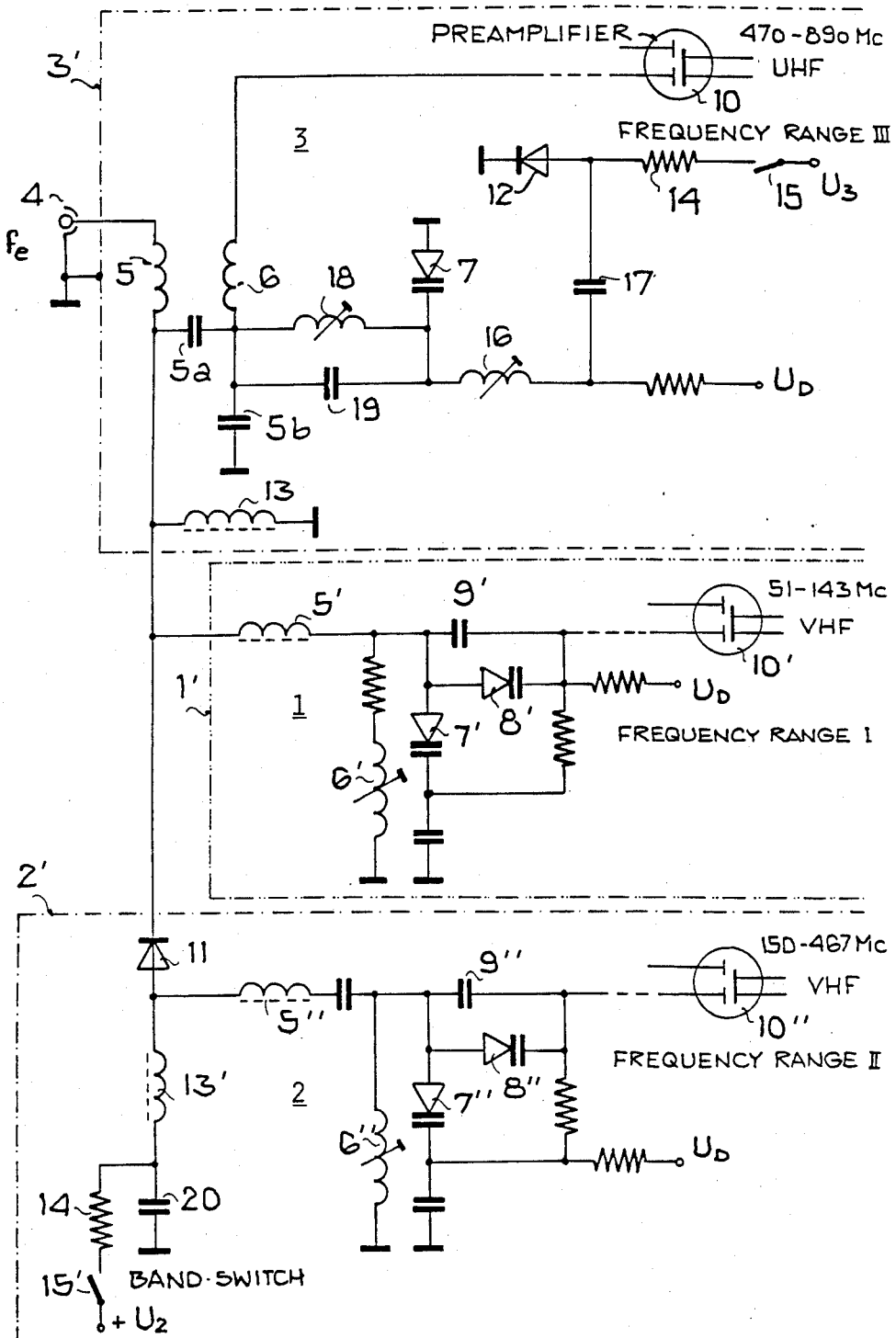

TELEVISION TUNER FOR THREE DIFFERENT FREQUENCY RANGES

CROSS REFERENCE TO RELATED APPLICATION

This application is related to Applicant's concurrently filed U.S. patent application Ser. No. 07/103,141.

BACKGROUND OF THE INVENTION

The invention relates to a television tuner for three different frequency ranges including a common antenna connection to which is connected three corresponding input filter circuits, each followed by a respective amplifier circuit, with always only that one of the amplifier circuits which is associated with the frequency range to be received being activated.

A television tuner of the above-mentioned type has already been disclosed (DE-OS No. 3,538,921 A1, published May 14th, 1987). In the disclosed tuner, a common antenna connection is provided for three input filter circuits associated with different frequency ranges. The input filter circuits are each followed by their own amplifying circuits, with always only that amplifying circuit being activated in whose frequency range a signal is to be received. The input filter circuit for the lowest frequency range is directly connected to the antenna connection while the other two input filter circuits are each connectable by means of switches which are located between the antenna connection and the associated input filter circuit.

SUMMARY OF THE INVENTION

The object underlying the invention is to take measures in a television tuner of the above general type which result in a simplified circuit design.

This object is achieved in accordance with the invention by a television tuner of the general type discussed above wherein: the antenna connection is spatially disposed in the proximity of the input filter circuit for the highest frequency range and is directly connected to one end of a coupling conductor which is coupled with the input circuit coil or input circuit conductor of the input filter circuit for the highest frequency range; the other end of the coupling conductor is directly connected to a coupling coil of the lowest frequency range input filter circuit and, via a switch, to the coupling coil of the input filter circuit associated with the medium frequency range; and a further switch is connected to a frequency determining element of the input filter circuit for the highest frequency range.

In a circuit design according to the invention, the spatial association of the antenna connection with the input filter circuit for the highest frequency range provides a short electrical connection to the coupling conductor of the respective input filter circuit as it is favorable for very high frequencies. Although this coupling conductor is connected in series with the coupling coils for the two lower frequency input filter circuits, the inductive reactance has practically no effect because the coupling conductor can be used for matching the filter circuits to the antenna connection and, for the lower frequencies, the inductive reactance value can be just about neglected. Due to the considerable differences in the frqeuencies to be received, the input filter circuit for the lowest frequency range can be connected directly to the coupling conductor of the input filter circuit for the highest frequency range while the input filter circuit for the medium frequency range can, if necessary, be connected to the antenna connection by means of a series-connected switch. If frequencies of the lower frequency ranges are received, the input filter circuit for the highest frequency range is detuned by means of a switch in such a way that no interfering subordinate resonances occur for the frequencies of the lower frequency ranges.

BRIEF DESCRIPTION OF THE DRAWING

The FIGURE is a circuit diagram of a preferred embodiment of a television tuner according to the invention.

DETAILED DESCRIPTION OF THE PREFERRED EMBODIMENT

In a television tuner for all channels between frequencies of 50 to 890 MHz, this entire frequency band is divided into three frequency ranges, i.e. frequency range I from 51 to 143 MHZ for receiving channels 2 to S6, frequency range II from 150 to 467 MHz for channels S7 to S41 and frequency range III from 470 to 890 MHz for channels 21 to C83. As shown in the Figure, each one of frequency ranges I to III has its own respective input filter circuit (1, 2, 3) which is fed from a common antenna connection (4). The input filter circuit (3) for the highest frequency range III is provided with an inductive coupling coil (5) in the form of a coupling conductor which is coupled inductively and/or capacitively with an input circuit coil (6) of input filter circuit (3). The antenna connection (4) is disposed spatially in the proximity of input filter circuit (3) and is connected directly to one end of coupling conductor (5). The other end of coupling conductor (5) is connected via a coupling capacitor (5a) to the input circuit coil (6) from which a further capacitor (5b) is connected to ground. At the same time, the second end of coupling conductor (5) is directly connected to an inductive coupling coil (5') of input filter circuit (1) for the lowest frequency range I and, in addition, via a switch (11) in the form of a switching diode, to the inductive coupling coil (5'') of input filter circuit (2) associated with medium frequency range II.

In input filter circuits (1 and 2), each respective coupling coil (5', 5'') leads to a respective circuit coil (6', 6'') and further filter elements, particularly to a respective variable capacitance tuning diode (7', 7'') and to a respective likewise variable capacitance coupling diode (8', 8''). The coupling diodes (8' and 8'') are arranged in parallel with respective coupling capacitors (9' and 9''), each disposed in the signal circuit leading to a respective preamplifier circuit (10', 10'') including a field effect transistor. The diodes (8', 8'', 9', 9'') are connected, via decoupling resistors, to a tuning voltage source UD. Also connected to the connecting wire from the coupling conductor (5) to the switch (11) is a decoupling coil (13) which is connected to ground at one end and forms a direct current path for the switch (11).

A further coil (13') has one end connected to the connecting wire from switch (11) to coupling coil (5'') of input filter circuit (2), and its second end connected, via a current limiting resistor (14) and a range selector (15'), to a range selecting voltage source U2 and also via a capacitor (20) to ground. The matching for range II is effected by the ratio between the coils (13' and 5''). The second pole of range selecting voltage source U2 is connected to ground.

Input filter circuit (3) also includes a switch (12) in the form of a switching diode. This circuit is connected to ground at one end and at the other end, via a decoupling resistor (14) and a range selector (15), to a range selecting voltage source U3. A capacitor 17 leads from the connecting wire between switch (12) and decoupling resistor (14) to an alignment coil (16) which is connected to tuning diode (7). A parallel circuit comprising a further alignment coil (18) and a capacitor (19) is located between the connection of input circuit coil (6) connected to coupling capacitor (5a) and the tuning diode (7). The tuning voltage UD is connected, via a further decoupling resistor, to the connection of capacitor (17) with coil (16). Moreover, the second pole of the range selecting voltage source U3 is likewise connected to ground.

If the range selectors (15 and 15') are open, in which case the preamplifier circuits (10 and 10') of the input band filter circuits (2, 3) are also without current, no current flows through switching diodes (11, 12), i.e. switching diodes (11, 12) are blocked. Their junction capacitance is then so low that, on the one hand, the reactive inductive or capacitive influences from input filter circuit (2) are cut off from the antenna connection (4) and, on the other hand, input filter circuit (3) for the highest frequency range is detuned to such an extent that no subordinate resonances can occur in frequency ranges I and II, respectively.

Thus, only input filter circuit (1) remains effective with its associated circuit (10') in the switched-on state. Since input filter circuit (2) is practically completely switched off via switch (11) and the capacitive load from input filter circuit (3) is almost negligible, input filter circuit (1) is subjected to almost no external load and thus the full tuning range of the associated tuning diode (7') can be utilized. Particularly towards higher frequencies, the influence of the relatively high input capacitance of field effect transistor (10') is also reduced by way of the then decreased junction capacitance of coupling diode (8'). Therefore, the tuning range is enlarged toward the higher frequency range end.

If the preamplifier circuit 10' of frequency range I is switched off, for example, range selector (15') in input filter circuit (2) is closed, current flows through switching diode (11) which thereby becomes conductive for high frequency signals as well. Hence the input signals travel from antenna connection (4) through coupling conductor (5), whose effect is negligible, to input filter circuit (2) which has essentially the same configuration as input filter circuit (1). Thus, corresponding input frequencies can be selected if preamplifier circuit (10") for frequency range II is in the switched-on state. As input filter circuit (1) for the lowest frequency range is decoupled or highly attenuated for the frequencies of frequency range II, particularly by means of coupling coil (5') which is provided with a ferrite core, no interfering resonances occur in medium frequency range II. Since input filter circuit (3) is detuned, in accordance with the object of the invention, by switching diode (12), interfering subordinate resonances from input filter circuit (3) can also not act on input filter circuit (2).

If the preamplifier circuit of frequency range III is switched on and the range selecting voltage source is connected by means of range selector (15) and current limiting resistor (14) to switching diode (12), in which case the other preamplifier circuits (10' and 10") are switched off and range selecting voltage source U2 is separated from switching diode (11) by means of the associated range selector (15'), input filter circuit (3) then exhibits its frequency characteristic required for frequency range III. Coupling conductor (5) then transmits the received frequency to input circuit coil (6) where it is selected and fed, by means of the subsequently connected preamplifier (10), to a subsequently connected filter and a mixer stages. The other preamplifier circuits (10' and 10") are also followed by corresponding filter circuits and mixer stages. If switching diode (11) is blocked and input filter circuits (1, 2) are practically cut off from antenna connection (4) by coupling coil (5), interference-free selection selection is thus also achieved for reception of the highest frequency range III, with negligible load from the input filter circuits for the lower frequency ranges I and II. In spite of all three input filter circuits being fed by one antenna connection, a very low mutual capacitive load results in all frequency ranges so that the above-mentioned wide tuning ranges can be tuned with commercially available tuning diodes (7, 7', 7").

Preferably, the three input filter circuits (1, 2, 3) are arranged in respective separate chambers (1', 2', 3") of a common housing with the chamber (1') for the lowest frequency input filter circuit (1) being arranged between the chambers (2', 3') of the two other frequency input filter circuits (2, 3).

I claim:

1. In a television tuner for three different frequency ranges including a common antenna connection to which three corresponding input filter circuits are connected, with each of these input filter circuits being followed by a respective amplifier circuit, with always only that one of the amplifier circuits which is associated with the frequency range to be received being activated; the improvement wherein: the antenna connection is spatially disposed in proximity of the input filter circuit for the highest frequency range, and is directly connected to one end of a coupling conductor which is coupled with an input circuit coil of the input filter circuit for the highest frequency range; the other end of said coupling conductor is directly connected to a coupling coil of the lowest frequency range input filter circuit and, via a switch, to a coupling coil of the input filter circuit associated with the medium frequency range; and a further switch is connected to a frequency determining element of the input filter circuit for the highest frequency range.

2. Television tuner according to claim 1, wherein said other end of the coupling conductor is connected, via a coupling capacitor, to the input circuit coil of the input filter circuit for the highest frequency range, and a further capacitor is connected from said input circuit coil of the input filter circuit for the highest frequency range to ground.

3. Television tuner according to claim 1, wherein said three input filter circuits are arranged in separate chambers of a common housing, and the chamber for the lowest frequency range input filter circuit is arranged between the chambers for the higher frequency range input filter circuits.

4. Television tuner according to claim 1, wherein the further switch is connected in series with a capacitor and with an alignment coil parallel to a tuning diode.

5. Television tuner according to claim 2, wherein said other end of the coupling conductor is connected, via a coupling capacitor, to the input circuit coil of the input filter circuit for the highest frequency range, and a further capacitor is connected from said input circuit coil of the input filter circuit for the highest frequency range to ground.

* * * * *